April 13, 1965

A. J. CLARK 3,177,729

TUNING SYSTEM

Filed April 26, 1962

INVENTOR.
ALFRED J. CLARK
BY Mueller & Aichele
ATTYS.

United States Patent Office 3,177,729

Patented Apr. 13, 1965

3,177,729

TUNING SYSTEM

Alfred J. Clark, Palatine, Ill., assignor to Motorola, Inc., Chicago, Ill., a corporation of Illinois Filed Apr. 26, 1962, Ser. No. 190,334
5 Claims. (Cl. 74—10.33)

This invention relates to pushbutton operated tuners for radio receivers, and more particularly to a declutching mechanism for such tuners.

Many tuners for radio receivers, aside from being operable by the customary rotatable tuning knob, are further operable by a plurality of pushbuttons which are depressible to set the tuner to a predetermined position. In such tuners it is desirable to have a clutch located between the rotatable tuning knob and the tuner itself, which clutch is disengageable upon depression of a particular pushbutton to decouple the manual tuning knob from the tuner as the pushbutton is depressed. By doing this, the force required to depress the pushbutton is reduced to a practical amount, since the gear reduction apparatus commonly associated with the tuning knob need not be overcome. This also prevents any accidental turning of the manual tuning knob from damaging the pushbutton tuning system when a pushbutton is depressed.

With the modern trend to reduction in the size of electronic components, the size of devices incorporating these components diminish accordingly, until it became desirable to reduce the size of the mechanical components of such devices in order to make full use of the space saving that resulted from the reduced size of electronic components. In connection with this, it became highly desirable to reduce the size of pushbutton tuning mechanisms for radio receivers, which necessarily meant reducing the size of the declutching mechanism for the tuner as well. Prior art devices were bulky, and furthermore positioned various biasing springs in such a manner that they at least partially opposed the spring return of the pushbutton. This can and often did result in a binding of the pushbutton's action.

Accordingly, it is an object of this invention to provide an improved pushbutton tuner for a radio receiver, which tuner has a declutching mechanism of compact size.

It is a further object of the invention to provide an improved pushbutton tuner for a radio receiver having a declutching mechanism, which tuner utilizes a minimum of parts and is low in cost.

It is a further object of the invention to provide an improved declutching mechanism for a pushbutton tuner, which mechanism reduces bias spring opposition to pushbutton return.

A feature of the invention is the provision of a pushbutton tuning system for a radio receiver having a lever actuated linearly displaceable element to disengage a clutch and decouple the manual tuning knob from the tuner drive shaft, the lever being pivotal from a position substantially parallel with the motion of the element by contact with pushbutton actuated slide means.

Another feature of the invention is the provision, in the above tuning system, of a slidable plate having a projection engageable with the lever for pivoting the same, which plate is displaceable by depression of any one of a number of pushbutton actuated slide members which move the plate in a common linear direction.

Another feature of the invention is the provision, in the above tuning system, of a slidable plate engageable with the lever at a single point for pivoting the same, which plate when engaged by any one of a plurality of pushbutton slide members for actuation, affords the same mechanical advantage to each.

Referring now to the drawings, FIG. 1 is a top plan view of a tuner utilizing the invention;

In a particular form of the invention a tuner for a radio receiver having a manually operable control knob contains a plurality of pushbuttons for automatic station selection. Each of the pushbutton slide members is in engagement with a slidable plate. A projection is formed in the slidable plate and is engageable with a lever. On the opposite side of the fulcrum of the lever from the projection is an actuating pin which is engageable with a groove in an extension fixed to a clutch member. The clutch member is mounted on the tuner shaft and when a pushbutton is depressed to tune the receiver, the slidable plate displaces the lever, causing the pin to actuate the clutch to disengagement. Thus the control knob is decoupled from the tuner shaft when the pushbutton turns the tuner shaft to select a particular station. A modification of the invention uses a raised cam portion on the slidable plate which is engageable with the lever to displace the lever upwardly to pivot the same and disengage the clutch.

Figure 1:
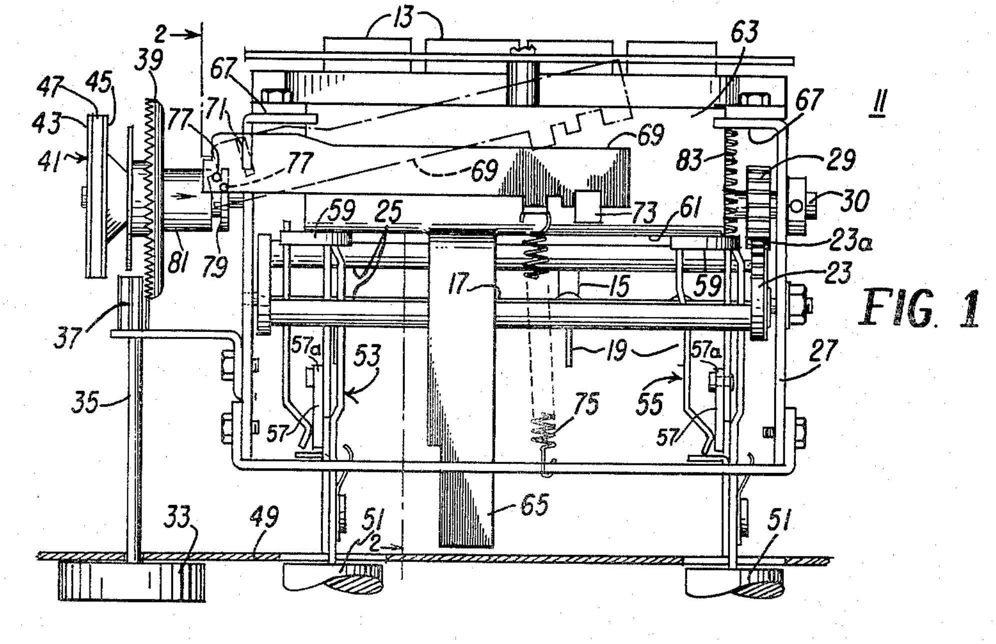
Figures 2, 3:
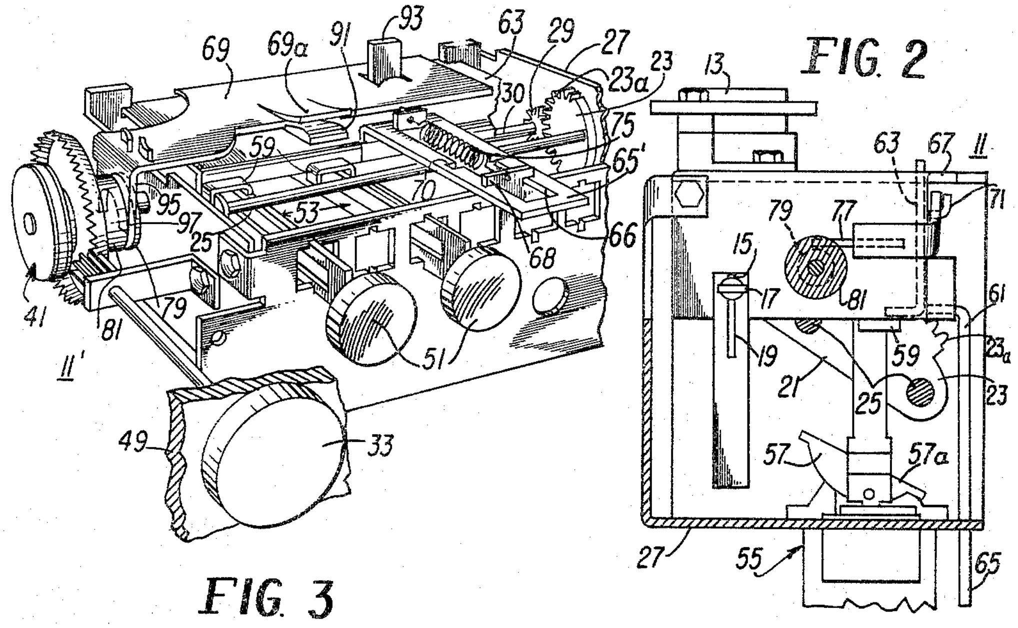
FIG. 2 is a sectional view taken along the line 2—2 of FIG. 1.
FIG. 3 is a perspective view of a modified form of the invention.

Referring now to the drawings, FIGS. 1 and 2 show a tuner 11 for a radio receiver. Tuner 11 contains a plurality of slug tuned coil units 13 and slidable tuning slugs 15. Tuning slugs 15 are interconected by a cross member 17, and are fixed thereto by means of adjustable extensions 19. Cross member 17 is fixed at either end to a tuning carriage comprising side members 21 and 23 and a pair of treadle bars 25. Side members 21 and 23 are pivotal on tuner frame 27.

Side member 23 has a geared portion 23*a* which is in engagement with tuner gear 29. Tuner gear 29 is fixed to shaft 30 and is driven by rotation thereof to rotate side member 23 and hence the tuning carriage, thereby moving tuning slugs 15 in coil units 13. Tuner shaft 30 may be operated from without the receiver by manually turning knob 33. This inturn rotates control shaft 35 through gear reduction means including control shaft gear 37 and tuner shaft gear 39. Gear 39 is freely rotatable on shaft 30 and imparts motion thereto only through clutch member 41, which is comprised of shaft plate 43 fixed to shaft 30, and gear plate 45 fixed to gear 39. A rubber washer 47 is interposed between plates 43 and 45 to aid in frictional engagement therebetween.

Coil units 13 may also be tuned by actuation of pushbuttons 51 disposed, as is knob 33, along the exterior surface of the receiver cabinet 49. Pushbuttons 51 are fixed to the ends of slide devices 53 and 55, which are of the push-to-lock type, each containing a presettable cam member 57. A locking portion 59 is formed in each of the slide members to compress the various elements of the slide member against cam member 57 and lock it in place. Cam member 57 is engageable with treadle bars 25 upon depression of the pushbutton 51 to bring bars 25 into alignment with surface 57*a* of cam member 57, thereby moving slugs 15 to a predetermined position.

To decouple knob 33 from pushbuttons 51 and prevent pushbuttons 51 from having to turn knob 33 unnecessarily, clutch 41 is provided as previously described. The locking portion 59 of each of slide devices 53 and 55 is engageable with shoulder 61 of slidable plate 63. As any one of pushbuttons 51 is depressed, plate 63 is linearly slidable, being guided by extension 65 which fits through a slot in frame 27, and by means of grooves in extension portions 67 formed in tuner frame 27. A lever 69 is pivotal about lug 71 formed in frame 27. Lever 69 is in engagement with projection 73 formed in plate 63 and is biased thereagainst by means of spring 75. The opposite end of lever 69 contains an actuating pin 77 extending therefrom at roughly a right angle, which pin fits in groove 79 formed in bushing 81. Pin 77 may be integral with lever 63, or may be secured thereto such as by welding. Bushing 81 is fixed to and is an extension of gear 39, and is freely rotatable on shaft 30.

As pushbutton 51 is depressed, thereby displacing plate 63, lever 69 is pivoted about lug 71 causing pin 77 to slide bushing 81 along shaft 30 to release the pressure of plate 45 on rubber washer 47 and plate 43. This effectively decouples knob 33 from shaft 30, in that shaft 30 may rotate freely without turning gear 39. Thus, as lever 69 is pivoted to the position shown in dotted lines in FIG. 1, bushing 81 will move in the direction of the arrow, disengaging clutch 41. Release of pushbutton 51 will cause the pushbutton to return to its original position due to the bias of a spring 83 on the associated key slide. In addition spring 75 will return lever 69 and hence plate 63 to their original positions as well. Thus, springs 75 and 83 work together to return pushbutton 51 to its original position. As pushbutton 51 is released, spring 75 returns clutch 41 into engagement, permitting manual tuning of coil units 13 by knob 33 once more. As an alternative to actuating plate 63 by contact with locking portions 59 of slides 53 and 55, other portions of slide 53 may be utilized to engage cooperating extensions on plate 63.

Referring now to FIG. 3, a modification of the invention is shown. Tuner 11′ is for the most part constructed in the same manner as tuner 11, however, the declutching system is altered. Plate 63 is provided with a raised cam portion 91 which is engageable with a ramp portion *69a* formed in lever 69. A stabilizing lug 93 is provided on frame 27 to guide the end of lever 69. Spring 75 biases plate 63 against locking portions 59 on slide devices 53. Plate 63 is guided by a modified extension 65′ which has an opening 66 for spring 75. Extension 65′ is guided by T-lug 68 on frame 27 and has notches 70 on the inside of opening 66 for assembling T-lug 68 therein. As any one of pushbuttons 51 is depressed, plate 63 is displaced to cause cam 91 to engage ramp *69a*. This will displace the end of lever 69 upwardly and cause the extension 95, which has a U-shaped portion 97 engaging groove 79, to move bushing 81 in the direction of the arrow thereby disengaging clutch 41. Lever 69 may be biased downwardly by a spring, not shown, to create the necessary clutch pressure. Spring 75, as before, aids pushbuttons 51 in returning to their original position.

Because lever 69 functions with the other elements in the described manner, it may be disposed along and above the tuner drive shaft 30, parallel with the declutching motion of bushing 81. Such an arrangement is found to minimize space requirements above and behind the tuner mechanism, and permits placement of the pushbutton slides relatively close together to reduce the width of the mechanism. In addition, by utilizing the sliding plate 63 to actuate lever 69, no special actuating portions need be formed in the slide devices 55. This is because the locking portions 59, which are used to lock the cam members 57 in position, are also used to engage plate 63. Also, because plate 63 engages lever 69 at the same point no matter which pushbutton is depressed, the same mechanical advantage exists for each pushbutton. This fact makes the pressure required to depress the pushbuttons uniform a desirable consumer feature.

It may therefore be seen that the invention provides an improved tuning mechanism for a radio receiver which mechanism occupies a minimum of space with few parts and in which spring opposition to the free movement of pushbutton slide devices is minimized.

I claim:

1. A tuning system for a radio receiver, including in combination, a frame for providing support for the components of the tuning system, a tuner shaft mounted in said frame and rotatable to tune the receiver, manually operable means for rotating said tuner shaft and including clutch means coupling said manually operable means to said tuner shaft and having a linearly displaceable element to disengage said clutch means and disable said manually operable means, a lever pivotal about a point on said frame from a position substantially parallel with the motion of said linearly displaceable element and having actuating means thereon engaged with said clutch means, manually depressible spring biased slide means, and means coupled to said shaft and engageable by said slide means upon depression thereof for turning said shaft for tuning the receiver, and a spring biased plate engageable by said slide means to be linearly slidable in the same direction as said slide means upon depression thereof, said plate having a raised cam portion thereon engaged with said lever to pivot said lever about an axis substantially parallel with the plane of said plate, so that when said lever is pivoted said clutch means will disengage to decouple said manually operable means from said tuner shaft.

2. A tuning system for a radio receiver, including in combination, a frame for providing support to the components of the tuning system, a tuner drive shaft mounted in said frame and rotatable to tune the receiver, a knob actuated tuning shaft for rotating said tuner drive shaft, torque transmitting means including clutch means coupling said tuning shaft to said tuner drive shaft, said clutch means having a linearly displaceable element to disengage said clutch means and decouple said tuning shaft from said tuner drive shaft, a lever pivotal about a point on said frame from a position substantially parallel with the motion of said linearly displaceable element and having a right angle extension thereon on one side of the pivot point of said lever and engaging said clutch means, a plurality of pushbutton actuable slide members, and means coupled to said shaft and engageable by each of said slide members upon depression thereof for turning said shaft for tuning the receiver, a plate linearly slidable in the same direction as said slide members upon depression thereof, each of said slide members having means thereon engageable with said plate for sliding the same, said plate having a projection thereon engaged with said lever on the side opposite said one side of the pivot point to pivot said lever about an axis substantially perpendicular to the plane of said plate, so that said lever affords a constant mechanical advantage to said slide members to disengage said clutch means and decouple said tuning shaft from said tuner drive shaft.

3. A tuning system for a radio receiver, including in combination, a frame for providing support to the components of the tuning system, a tuner drive shaft mounted in said frame and rotatable to tune the receiver, a knob actuated tuning shaft for rotating said tuner drive shaft, torque transmitting means including clutch means coupling said tuning shaft to said tuner drive shaft, said clutch means having a linearly displaceable element to disengage said clutch and decouple said tuning shaft from said tuner drive shaft, a lever pivotal about a point on said frame from a position substantially parallel with the motion of said linearly displaceable element and having a right angle extension thereon on one side of the pivot point of said lever and engaging said clutch means, a plurality of pushbutton actuable slide members, and means coupled to said tuner drive shaft and engageable by said slide members upon depression thereof for turning said shaft for tuning the receiver, and a plate linearly slidable in the same direction as said slide members upon depression thereof, each of said slide members having a portion thereon engageable with said plate to slide the same, said plate having a raised cam portion thereon engaged with said lever on the side opposite said one side of a pivot point to pivot said lever about an axis substantially parallel with the plane of said plate, so that said lever affords a constant mechanical advantage for said slide members to disengage said clutch means and decouple said tuning shaft from said tuner drive shaft.

4. A tuning system for a radio receiver including in combination, a frame, a tuning shaft mounted on said frame and rotatable to tune the receiver, manually operable means mounted on said frame for rotating said tuner shaft and including clutch means having a linearly displaceable element to disengage said clutch means and disable said manually operable means, a lever pivotal about a point on said frame from a position substantially parallel with the motion of said linearly displaceable element and having actuating means thereon engaged with said linearly displaceable element of said clutch means, manually depressible slide means supported on said frame, means coupled to said shaft and engageable by said slide means upon depression thereof for turning said shaft for tuning the receiver, and a plate engageable by said slide means to be linearly slidable in the same direction as said slide means upon depression thereof, said plate being engaged with said lever to pivot said lever and displace said element to thereby disengage said clutch means and decouple said manually operable means from said tuner shaft.

5. A tuning system for a radio receiver including in combination, a frame, a tuner shaft mounted on said frame and rotatable to tune the receiver, manually operable means mounted on said frame for rotating said tuner shaft and including clutch means having a linearly displaceable element to disengage said clutch means and disable said manually operable means, a lever pivoted about a point on said frame from a position substantially parallel with the motion of said linearly displaceable element and having actuating means thereon engaged with said linearly displaceable element of said clutch means, spring biased manually depressible slide means supported on said frame, means coupled to said shaft and engageable by said slide means upon depression thereof for turning said shaft for tuning the receiver, and a spring biased plate engageable by said slide means to be linearly slideable in the same direction as said slide means upon depression thereof, said plate having a projection thereon engaged with said lever to pivot said lever about an axis substantially perpendicular to the plane of said plate, with pivotal movement of said lever displacing said element to disengage said clutch means and decouple said manually operable means from said tuner shaft.

References Cited by the Examiner

UNITED STATES PATENTS 2,857,519 10/58 Gaskill et al. -------- 74—10.27 X

BROUGHTON G. DURHAM, *Primary Examiner.*

DON A. WAITE, *Examiner.*